US005605855A

United States Patent [19]

Chang et al.

[11] Patent Number: 5,605,855
[45] Date of Patent: Feb. 25, 1997

[54] PROCESS FOR FABRICATING A GRADED-CHANNEL MOS DEVICE

[75] Inventors: Ko-Min Chang; Marius Orlowski; Craig Swift; Shih-Wei Sun; Shiang-Chyong Luo, all of Austin, Tex.

[73] Assignee: Motorola Inc., Schaumburg, Ill.

[21] Appl. No.: 395,339

[22] Filed: Feb. 28, 1995

[51] Int. Cl.⁶ .............................................. H01L 21/8234
[52] U.S. Cl. ............................... 437/45; 437/44; 257/345
[58] Field of Search .................................. 437/40, 41, 44, 437/45; 257/345

[56] References Cited

U.S. PATENT DOCUMENTS

| | | | |
|---|---|---|---|
| 4,371,955 | 2/1983 | Sasaki | 365/185 |
| 4,599,118 | 7/1986 | Han et al. | 148/1.5 |
| 4,680,604 | 7/1987 | Nakagawa et al. | 357/23.4 |
| 4,697,198 | 9/1987 | Komori et al. | 357/23.3 |
| 5,021,845 | 6/1991 | Hashimoto | 357/23.4 |
| 5,082,794 | 1/1992 | Pfiester et al. | 437/40 |
| 5,175,119 | 12/1992 | Matsutani | 437/43 |
| 5,372,960 | 12/1994 | Davies et al. | 437/44 |
| 5,374,574 | 12/1994 | Kwon | 437/44 |
| 5,374,575 | 12/1994 | Kim et al. | 437/44 |
| 5,399,508 | 3/1995 | Nowak | 437/27 |
| 5,427,964 | 6/1995 | Kaneshiro et al. | 437/41 |
| 5,429,956 | 7/1995 | Shell et al. | 437/29 |
| 5,434,093 | 7/1995 | Chau et al. | 437/41 |
| 5,472,897 | 12/1995 | Hsu et al. | 437/44 |
| 5,482,878 | 1/1996 | Burger et al. | 437/41 |
| 5,484,743 | 1/1996 | Ko et al. | 437/44 |
| 5,538,913 | 7/1996 | Hong | 437/44 |

FOREIGN PATENT DOCUMENTS 53-112069  9/1978  Japan ............................. H01L 29/78

OTHER PUBLICATIONS

Yoshinori Okumura, "Source-to-Drain Nonuniformly Doped Channel (NUDC) MOSFET Structures for High Current Drivability and Threshold Voltage Controllability", IEEE Transactions on Electron Devices, vol. 39, No. 11, Nov. 1992, pp. 2541-2552.

Primary Examiner—John Niebling
Assistant Examiner—Richard A. Booth
Attorney, Agent, or Firm—Jasper W. Dockrey; George R. Meyer

[57] ABSTRACT

A process for fabricating a graded-channel MOS device includes the formation of a masking layer (16) on the surface of a semiconductor substrate (10) and separated from the surface by a gate oxide layer (12). A first doped region (22) is formed in a channel region (20) of the semiconductor substrate (10) using the masking layer (16) as a doping mask. A second doped region (24) is formed in the channel region (20) and extends from the principal surface (14) of the semiconductor substrate (10) to the first doped region (22). A gate electrode (34) is formed within an opening (18) in the masking layer (16) and aligned to the channel region (20). Upon removal of the masking layer (16) source and drain regions (36, 38) are formed in the semiconductor substrate (10) and aligned to the gate electrode (34).

9 Claims, 3 Drawing Sheets

PROCESS FOR FABRICATING A GRADED-CHANNEL MOS DEVICE

FIELD OF THE INVENTION

This invention relates, in general, to a method for fabricating a semiconductor device, and more particularly, to a method for fabricating an MOS device having a nonuniform channel doping profile.

BACKGROUND OF THE INVENTION

As individual transistors within integrated circuits are scaled to smaller and smaller dimensions, engineering refinements in transistor design are necessary to maintain optimum device performance. Typically, in metal-oxide-semiconductor (MOS) devices having channel lengths in the submicron range, the drain regions must be carefully fabricated to avoid performance degradation arising from hot carrier injection, drain leakage, punch-through, and the like. Where the transistor channel length is near one micron, many device performance problems can be corrected by forming a lightly-doped-drain (LDD) region. The LDD region lowers the electric field in the channel region of the transistor in the immediate vicinity of the drain region. The reduced electric field in the channel region improves the threshold voltage stability of the transistor by reducing hot carrier injection into the gate oxide layer overlying the channel region. However, when the channel length of the transistor is reduced to dimensions near 0.5 microns and below, drain engineering techniques, such as LDD and the like, fail to prevent performance degradation.

Additionally, counter doped source-drain regions have been used to reduce subsurface punch-through in short channel devices. In the case of an n-channel device, a boron "halo" is formed around the n-type source and drain regions. Although the halo is effective in reducing punch-through, the drive current of the transistor is also reduced leading to poor performance. To further reduce the impact of device performance degradation arising from short channel effects, transistors have been designed to operate at supply voltages of less than 5 volts. However, submicron devices operating at supply voltages of 3 volts continue to exhibit poor device performance even when drain engineering techniques are applied.

Recent development effort in submicron device design has been directed toward engineering the doping junction profiles within the channel region itself. MOS devices having a non-uniformly doped channel can be obtained by providing precisely tailored doping concentration gradients within the channel region of the transistor. To form symmetrical doped regions within the channel region requires that they be precisely defined within the channel region to avoid any asymmetry in the doping concentration profile within the channel region. Channel doping techniques which rely on the critical alignment of photolithographic layers can result in asymmetrical doping profiles if the lithographic alignment does not meet required alignment tolerances. Accordingly, further process development is necessary to provide an MOS device having non-uniform channel doping that can be reliably manufactured, and to provide completely symmetrical doping profiles in submicron transistors.

SUMMARY OF THE INVENTION

The invention provides a process for fabricating a graded-channel-metal-oxide-semiconductor (GCMOS) device. The inventive process provides a symmetrically-distributed, nonuniform doping concentration in the channel region of the GCMOS device. The nonuniform channel doping profile improves device performance parameters, such as drive current, off-leakage, parasitic capacitance, and threshold voltage stability, in MOS devices having submicron channel lengths and operating at supply voltages of less than 5 volts. In practicing the present invention, a semiconductor substrate is provided having a masking layer defined on the surface of the substrate. An opening in the masking layer exposes a channel region of the semiconductor substrate. A doped region is formed in the channel region while remaining portions of the channel region remained undoped. Then, a gate electrode is formed in the opening and the masking layer is removed. After removing the masking layer, source and drain regions are formed in the semiconductor substrate that are self-aligned to the gate electrode. The process provides a doped region within the channel region which is spaced apart from the source and drain regions by the remaining undoped portions of the channel region.

Figure 1:
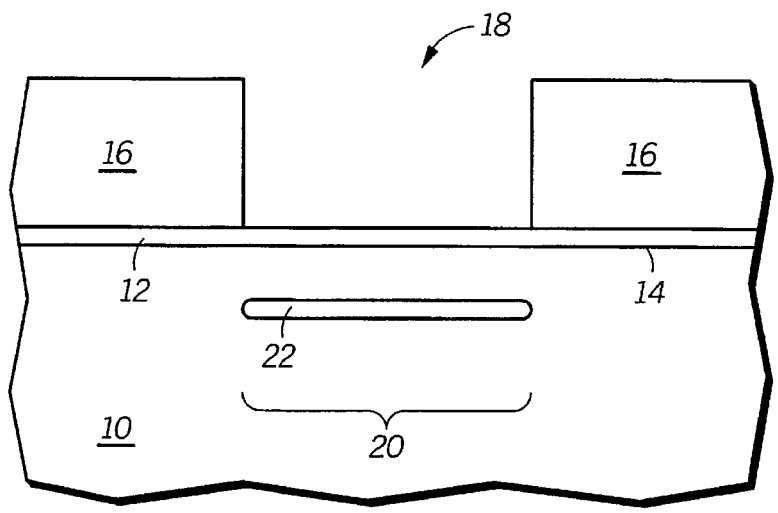
FIG. 1 illustrates, in cross-section, the formation of a doped region in a semiconductor substrate using a pattern masking layer.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides a process for the fabrication of an MOS device having a non-uniformly doped channel region. For convenience, the term "graded-channel-MOS (GCMOS) device" will be used herein to describe an MOS transistor fabricated in accordance with the invention. The process of the invention provides a precisely engineered channel region in an MOS device having a submicron channel length. The symmetrical doping profiles produced in the center of the channel region of the MOS device provide maximum performance characteristics even at a supply voltage of less than 5 volts. A GCMOS device fabricated in accordance with the invention exhibits high drive current, low off-leakage, low parasitic capacitance, and low body effect at supply voltages of less than 5 volts.

For purposes of illustration the invention is described with reference to the fabrication of an n-channel MOS transistor. However, those skilled in the art will recognize that p-channel transistors can be made by the same process with an appropriate change in doping types. Likewise, with appropriate masking, CMOS devices can be made by the same process. Further, the figures illustrate the fabrication of only a portion of a semiconductor device. In the fabrication of an actual integrated circuit, the illustrated structure would be repeated many times in each circuit of the device.

Shown in FIG. 1, in cross-section, is a portion of a semiconductor substrate 10 having already undergone several process steps in accordance with the invention. A gate oxide layer 12 overlies a principal surface 14 of semiconductor substrate 10, and a masking layer 16 overlies gate oxide layer 12. An opening 18 in masking layer 16 exposes a channel region 20 of semiconductor substrate 10.

Preferably, gate oxide layer 12 is formed by the thermal oxidation of principal surface 14 to form a silicon dioxide layer thereon. The thickness of gate oxide layer 12 can vary from about 40 to 150 angstroms depending upon the gate length of the MOS device being fabricated. For example, for the fabrication of an MOS transistor having a channel length of about 0.5 microns, the preferred gate oxide thickness is about 90 angstroms. Masking layer 16 is preferably silicon nitride deposited by chemical vapor deposition to a thickness of about 1500 to 3500 angstroms. To form opening 18, a photolithographic mask (not shown) is defined to overlie the deposited silicon nitride layer, and a reactive ion etching process is carried out to anisotropically etch the silicon nitride.

In accordance with the invention, the formation of symmetrically disposed doped regions in the channel region of an MOS transistor will now be described. It is important to note that the present invention contemplates the formation of both a single doped region in the channel region, and multiple doped regions within channel region 20. For the purpose of completeness of description, the illustrative embodiment described herein includes the formation of two doped regions. However, those skilled in the art will appreciate that the advantages of the invention can be obtained through the formation of only one of the doped regions described herein. Furthermore, it is also possible to form additional doped regions than those illustrated herein. For example, through the use of high energy ion implantation and the like.

The inventive process continues by performing an ion implantation process to form a first doped region 22 in channel region 20, which is self-aligned to opening 18. Preferably, first doped region 22 is formed by the ion implantation of boron using an implant dose of about 5.0 E11 to 5.0 E12 ions/cm$^2$ at an implant energy of about 30 to 80 keV. The implant energy is adjusted depending upon the thickness of gate oxide layer 12 in order to place the peek concentration of the implanted boron atoms at a predetermined depth in semiconductor substrate 10. Preferably, following subsequent annealing cycles, the peak dopant concentration of first doped region 22 about 1.0 E17 atoms/cm$^3$ and resides in substrate 10 at a distance of about 0.3 microns below principal surface 14.

Additionally, for the fabrication of n-channel devices dopants other than boron can be used to form a doped region in the channel region. For example, first doped region 22 can be formed by implantation of indium at a dose of about 8.0 E12 using an implant energy of about 120 keV.

Figure 2A:
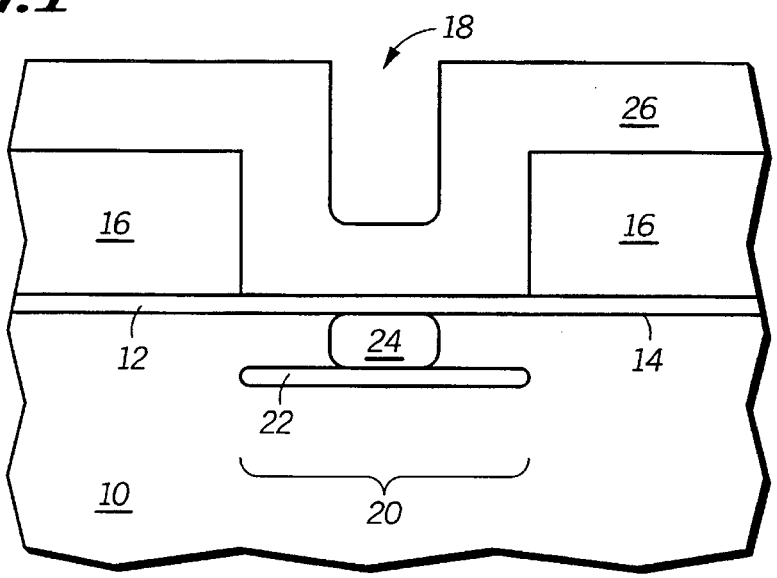
FIG. 2A illustrates, in cross-section, the formation of a second doped region in the semiconductor substrate in accordance with one embodiment of the invention.
Figure 2B:
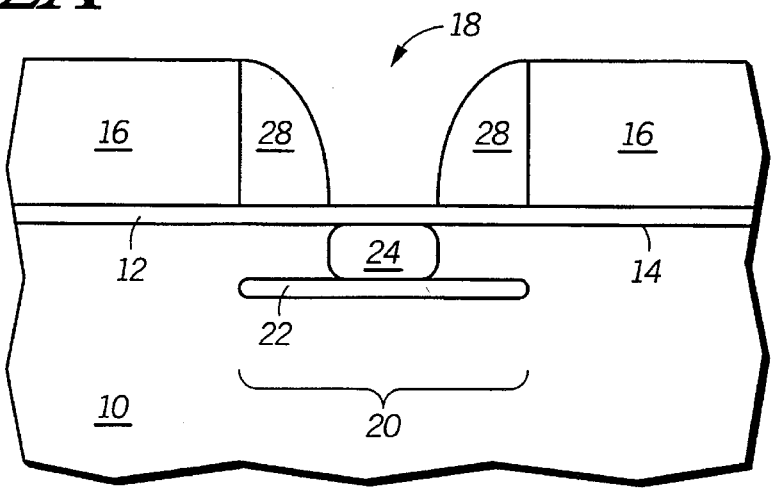
FIG. 2B illustrates, in cross-section, the formation of a second doped region in the semiconductor substrate in accordance with another embodiment of the invention.
Figure 3:
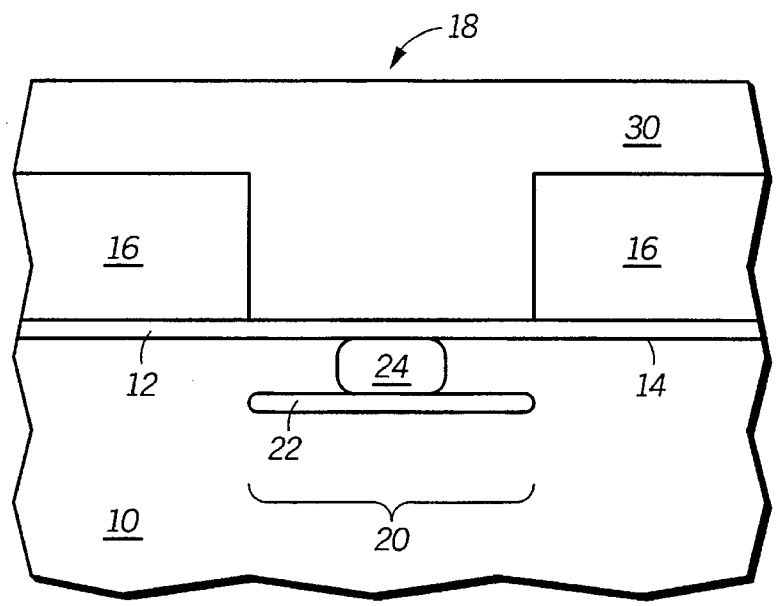
FIGS. 3–4 illustrate, in cross-section, process steps in accordance with the invention for the fabrication of a gate electrode.

After forming first doped region 22, a second doped region 24 is formed in substrate 10 using one of two methods illustrated in FIG. 2A and FIG. 2B. In the method illustrated in FIG. 2A, a first semiconductor layer 26 is deposited by chemical vapor deposition to overlie masking layer 16 and the surface portion of substrate 10 exposed by opening 18. Preferably, the first semiconductor layer 26 is polysilicon deposited to a thickness of about 1000 to 2000 angstroms, and most preferably about 1500 angstroms. The polysilicon is doped with phosphorus to increase the electrical conductivity. The doping process can be performed either during deposition or immediately afterward. Alternatively, other semiconductor materials can be deposited, such as refractory metal silicides and the like.

The chemical vapor deposition process is adjusted to conformally deposit first polysilicon layer 26 to follow the contour of masking layer 16. As illustrated in FIG. 2A, the conformal deposition results in the formation of a depressed region in first semiconductor layer 26 located at the midpoint of the lateral dimension of opening 18. Accordingly, the vertical thickness of first semiconductor layer 26 equals the deposition thickness in the center of opening 18. By conformally depositing first semiconductor layer 26, a thickness differential is obtained in opening 18, which provides a precisely contoured implantation mask for the formation of second doped region 24.

The ion implant parameters are adjusted, such that following an annealing cycle, second doped region 24 will extend from principal surface 14 into substrate 10 and contact first doped region 22. Accordingly, the ion implant energy employed will depend upon the deposited thickness of first semiconductor layer 26. For example, where the thickness of first semiconductor layer 26 is 1,000 angstroms, boron ions are implanted at an energy of about 20 to 60 keV, whereas if the deposited thickness of first semiconductor layer 26 is 3,000 angstroms, boron is implanted at an energy of about 80 to 120 keV. Preferably, the ion implant process is adjusted to deliver a boron dose of about 5.0 E11 to 5.0 E13 ions/cm$^2$. The particular boron dose and energy used will provide a peak concentration of boron at a depth of about 0.1 microns below principal surface 14, and a peak doping concentration of about 1.0 E17 to 5.0 E17 atoms/cm$^3$.

Those skilled in the art will appreciate that the doping processes of the invention provide a distribution of dopant atoms in the substrate. Although implant parameters are adjusted to place a peak doping concentration to a specified depth in the substrate, a certain amount of ranging and straggle is associated with the implant process. Although the figures illustrate ideal dopant distributions, some overlap of doping regions will occur.

An alternative method for the fabrication of second doped region 24 is illustrated in FIG. 2B. In the alternative method, first semiconductor layer 26 is deposited according to the method described above. Once the semiconductor material is deposited, a reactive ion etching process is carried out to form sidewall spacers 28 adjacent to the walls of opening 18. The lateral extent of sidewall spacers 28 along principal surface 14 is determined by a number of process parameters. The process parameters include, the deposition thickness of the polysilicon layer, the thickness of masking layer 16, the etching time, and the like. Accordingly, the separation distance of sidewall spacers 28 is also determined by the aforementioned process parameters. Since the separation distance of sidewall spacers 28 also determine the lateral extent of second doped region 24 in substrate 10, the deposition thickness of the polysilicon layer is also determinative of the lateral extent of second doped region 24. Preferably, the polysilicon layer is deposited to a thickness of about 1000 to 2000 angstroms and the etching time is adjusted to achieve the desired later distance in view of the deposition thickness of masking layer 16. Once sidewall spacers 28 are formed, boron is ion implanted into substrate 10 using a dose of about 5.0 E11 to 5.0 E13 /cm² at an implant energy of about 10 to 25 keV.

It is important to note that the polysilicon deposition step illustrated in FIGS. 2A and 2B represents the first step in the fabrication of a gate electrode for the MOS device under construction. After second doped region 24 is formed, a second semiconductor layer 30 is deposited to overlie either first semiconductor layer 26, or sidewall spacers 28, depending upon the particular process employed to form second doped region 24. Preferably, second semiconductor layer 30 is polysilicon deposited to a thickness of about 1000 to 2000 angstroms. Preferably, second semiconductor layer 30 fills opening 18 and forms a somewhat planar surface overlying masking layer 16. It is important to note that the deposition of second semiconductor layer 30 is carried out in such a manner as to form a somewhat planar surface, regardless of whether or not sidewall spacers are formed after depositing first semiconductor layer 26. Also, the formation of a planar surface is not essential to the process of the invention.

Figure 4:
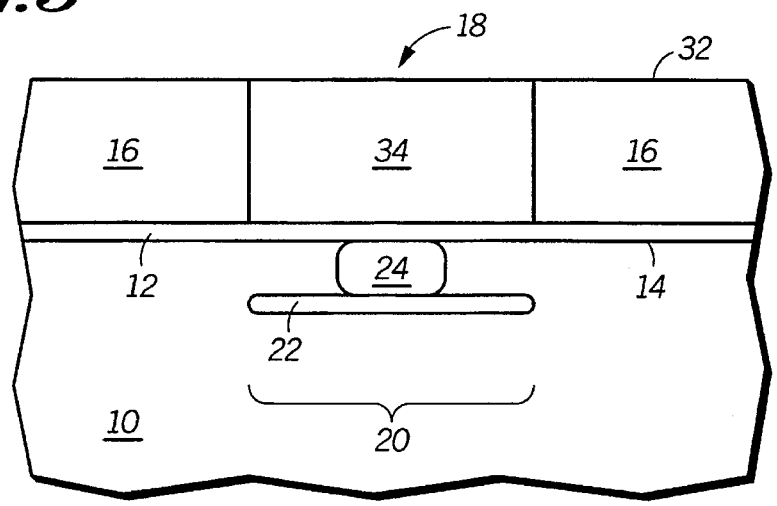

After depositing second semiconductor layer 30, a planarization process is carried out to form a planar surface 32, as illustrated in FIG. 4. Preferably, a chemical-mechanical-polishing process is carried out to remove surface portions of second semiconductor layer 30, and if present, portions of first semiconductor layer 26. Additionally, a portion of the upper surface of masking layer 16 can also be removed during the polishing process. The polishing process employs an abrasive slurry composed of silica particles and a chemical etchant to grind away successive surface layers and form a smooth surface. The chemical composition of the slurry can be adjusted to selectively remove one material composition to that of another material compensation. Alternatively, the slurry can be adjusted to non-selectively remove many different kinds of material. In the present embodiment of the invention, a non-selective slurry is employed which removes polysilicon and silicon nitride at substantially the same rate. Accordingly, the polishing time will determine the vertical dimension of the polysilicon material overlying semiconductor substrate 10 in opening 18.

Alternatively, other kinds of planarization processes can be used to form planar surface 32. For example, ion sputtering, focus molecular beam bombardment, non-selective plasma etching, and the like, can be used to form planar surface 32. Preferably, the planarization process is carried out for an amount of time sufficient to remove surface layers of polysilicon material, and to leave about 1000 to 3000 angstroms of polysilicon in opening 18 overlying principal surface 14.

Figure 5A:
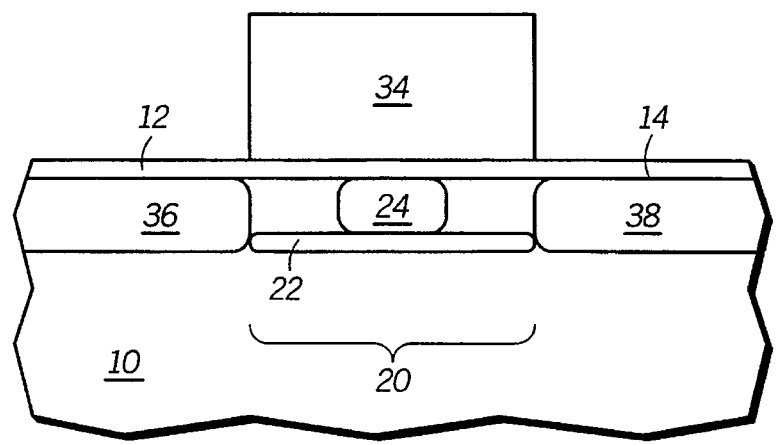
FIG. 5A illustrates, in cross-section, the formation of source and drain regions in accordance with one embodiment of the invention.
Figure 5B:
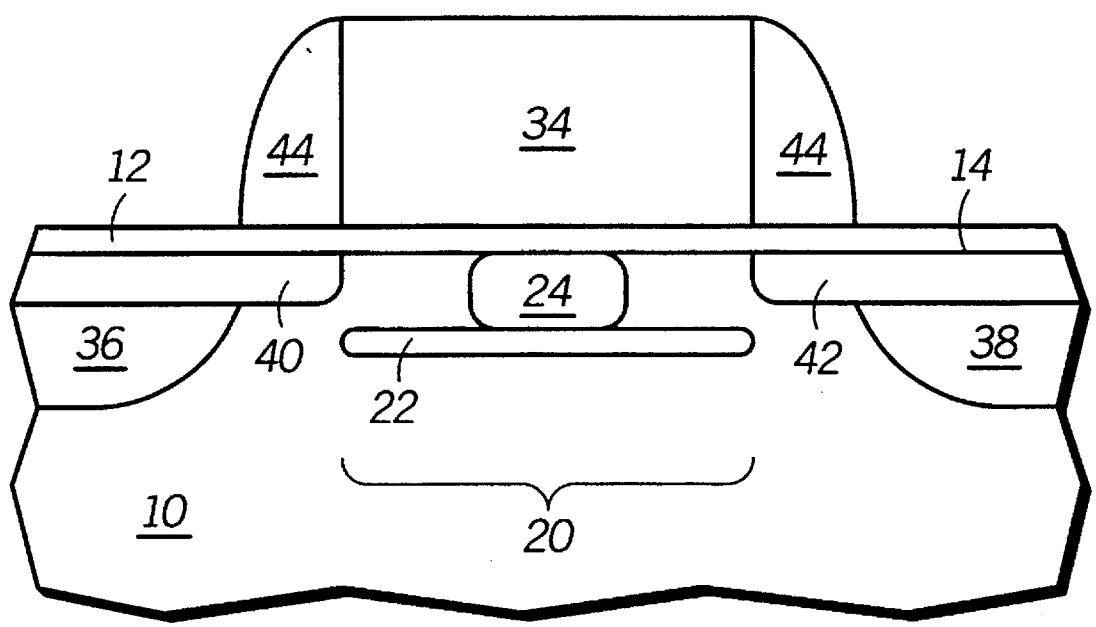
FIG. 5B illustrates, in cross-section, the formation of a lightly doped drain region in accordance with another embodiment of the invention.

Depending upon the desired performance characteristics of the MOS device under construction, one of two different source drain configurations can be formed, as illustrated in FIG. 5A and FIG. 5B. To construct the device illustrated in FIG. 5A, once planar surface 32 is formed, masking layer 16 is removed leaving a gate electrode 34 overlying channel region 20 of semiconductor substrate 10. Gate electrode 34 is separated from channel region 20 by gate oxide layer 12. After gate electrode 34 is defined by the removal of masking layer 16, an ion implant process is carried out to form source and drain regions 36 and 38, respectively. Preferably, source and drain regions 36 and 38 are formed by the ion implantation of either arsenic or phosphorous into semiconductor substrate 10 using gate electrode 34 as an implant mask. Accordingly, source and drain regions 36 and 38 are self-aligned to gate electrode 34 and are spaced apart in semiconductor substrate 10 by channel region 20. Where arsenic is used to form the source and drain regions, the arsenic is preferably implanted using a dose of about 1.0 E15 to 5.0 E15 ions/cm² at an energy of about 30 to 80 keV. Where phosphorous is used, the phosphorous is preferably implanted using a dose of about 1.0 E15 to 5.0 E15 ions/cm² at an energy of about 20 to 60 keV.

Those skilled in the art will appreciate that in many applications a lightly doped drain region is necessary to avoid problems associated with hot carrier injection. Accordingly, a lightly doped drain structure can be formed as illustrated in FIG. 5B. Once gate electrode 34 is defined by removing masking layer 16, an ion implant process is carried out to form lightly doped regions 40 and 42, using gate electrode 34 as an implantation mask. Then, a dielectric material is deposited to overlie substrate 10 and a reactive ion etching process is carried out to form dielectric sidewall spacers 44. Once sidewall spacers 44 are formed, the ion implant process described in relation to FIG. 5A is carried out to form source and drain regions 36 and 38, respectively. Lightly doped regions 40 and 42 are formed by the implantation of either arsenic or phosphorous. Where phosphorous is used, the phosphorous is preferably implanted using a dose of about 5.0 E12 to 1.0 E14 ions/cm², at an implant energy of about 20 to 60 keV. Where arsenic is used, the arsenic is preferably implanted using a dose of about 5.0 E12 to 1.0 E14 ion/cm² at an implant energy of about 30 to 80 keV.

The ion implantation process to form source and drain regions 36 and 38 is performed such that following an annealing process, the source and drain regions will have a peak doping concentration of about 1.0 E21 atoms/cm³. Preferably, the peak doping concentration of the source drain regions resides in substrate 10 about 0.1 microns below principal surface 14.

The foregoing process description provides an n-channel MOS transistor preferably having a threshold voltage of about 0.2 to 0.4 volts, and most preferably about 0.35 volts. The device preferably exhibits an on-current of about 50 to 65 microamps/micron at a drain voltage of about 1.2 volts and a gate voltage of about 0.9 volts. Correspondingly, a device fabricated in accordance with the invention preferably exhibits an off current of about 1 to 5 picoamps/micron at a drain voltage of about 1.2 volts and a gate voltage of about 0 volts. Furthermore, a device fabricated in accordance with the invention exhibits a body effect acting on the threshold voltage of about 100 to 200 millivolts at a substrate bias ranging from −2 volts to 0 volts. The foregoing parameters are the preferred operational characteristics of a device fabricated in accordance with the invention and operating at a supply voltage of preferably less than 5 volts. The process of the invention advantageously provides an MOS device that can operate a voltages substantially below 5 volts. For example, the device will perform at high efficiency at operating voltages of 3 volts to as low as about 1 volt.

It is important to note that in the foregoing process, the gate electrode and channel region of the MOS device are defined by a patterned masking layer formed on the surface of semiconductor substrate 10. This process stands in distinct contrast to fabrication processes of the prior art. By using a patterned masking layer to define both the channel region and the gate electrode of an MOS device, a high degree of precision can be used in the fabrication of doped regions within the channel region of the device. Additionally, once the precisely defined doped regions are formed, the gate electrode is positioned directly over the channel region and self aligned to the channel region. The device is further refined by coupling the channel fabrication process with a self-aligned source-drain process to yield a submicron MOS transistor having superior performance characteristics.

Thus it is apparent that there has been provided, in accordance with the invention, a process for fabricating a GCMOS device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, although two distinct doped regions are formed in the channel region in the foregoing process description, the advantages of the invention can be realized through the fabrication of only one of the two doped regions illustrated in the foregoing process embodiment. Accordingly, a fully functional MOS device exhibiting all of the advantages of the invention can be realized by omitting the fabrication of either first doped region 22 or second doped region 24. Additionally, for the fabrication of p-channel devices, phosphorus or antimony can be implanted into the channel region. It is therefore intended to include within the invention all such variations and modifications as fall within the scope of the appended claims and equivalents thereof.

We claim:

1. A process for fabricating a semiconductor device comprising the steps of:

providing a semiconductor substrate of a first conductivity type having a surface;

defining a channel region in the semiconductor substrate;

forming a first doped region of the first conductivity type in the channel region;

forming a second doped region of the first conductivity type in the channel region, wherein:
   the second doped region extends from the surface to the first doped region and separates the first doped region from the surface;
   the second doped region is narrower in cross-sectional width than the first doped region; and
   the steps of forming the first doped region and forming the second doped region are performed during separate processing steps;

forming a gate electrode overlying the channel region; and forming source and drain regions of a second conductivity type in the semiconductor substrate on either side of the gate electrode.

2. The process of claim 1, wherein the step of forming a gate electrode comprises the steps of:

providing a masking layer overlying the surface, the masking layer having an opening therein exposing the channel region;

depositing a first semiconductor layer overlying the masking layer and the channel region;

depositing a second semiconductor layer overlying the first semiconductor layer; and removing a portion of the first and second semiconductor layers to form a planar surface.

3. The process of claim 2, wherein the step of forming the second doped region comprises ion implantation through the first semiconductor layer prior to depositing the second semiconductor layer.

4. The process of claim 1 wherein the step of forming a gate electrode comprises the steps of:

providing a masking layer overlying the surface, the masking layer having an opening therein exposing the channel region;

depositing a first semiconductor layer overlying the masking layer and the channel region;

etching the first semiconductor layer to form sidewall spacers in the opening;

depositing a second semiconductor layer overlying the sidewall spacers; and removing a portion of the second semiconductor layer to form a planar surface.

5. The process of claim 1, further comprising steps of:

providing a masking layer overlying the surface, the masking layer having an opening therein exposing the channel region; and forming sidewall spacers within the opening prior to the step of forming the second doped region, wherein the step of forming a second doped region comprises ion implantation using the sidewall spacers as an implantation mask.

6. The process of claim 1, wherein the second doped region is spaced apart from the source and drain regions a first distance and the first doped region is spaced apart from the source and drain regions a second distance.

7. The process of claim 6, wherein the first distance is greater than the second distance.

8. The process of claim 2, wherein the step of forming the first doped region further comprises ion implantation into the channel region prior to depositing the first semiconductor layer.

9. The process of claim 1, further comprising steps of:

providing a masking layer overlying the surface, the masking layer having an opening therein exposing the channel region; and depositing a first semiconductor layer overlying the masking layer and the channel region, wherein the step of forming a first doped region further comprises ion implantation into the channel region prior to depositing the first semiconductor layer.

* * * * *